United States Patent
Lin et al.

(10) Patent No.: US 8,299,952 B1
(45) Date of Patent: Oct. 30, 2012

(54) SWITCHED-CAPACITOR CIRCUIT AND PIPELINED ANALOG-TO-DIGITAL CONVERTER

(75) Inventors: Jin-Fu Lin, Tainan (TW); Chia-Hsuan Huang, Tainan (TW)

(73) Assignee: Himax Technologies Limited, Tainan County (TW)

( * ) Notice: Subject to any disclaimer, the term of this patent is extended or adjusted under 35 U.S.C. 154(b) by 80 days.

(21) Appl. No.: 13/093,649

(22) Filed: Apr. 25, 2011

(51) Int. Cl.
 *H03M 1/12* (2006.01)
(52) U.S. Cl. .................... 341/172; 341/161; 341/162
(58) Field of Classification Search .................. 341/161, 341/162, 172
See application file for complete search history.

(56) References Cited

U.S. PATENT DOCUMENTS

| | | | | |
|---|---|---|---|---|
| 5,929,796 A * | 7/1999 | Opris et al. | ................. | 341/120 |
| 6,184,809 B1 * | 2/2001 | Yu | ................. | 341/120 |
| 6,967,610 B1 * | 11/2005 | Sutardja et al. | ................. | 341/161 |
| 7,429,946 B2 * | 9/2008 | Huang | ................. | 341/172 |
| 7,612,700 B2 * | 11/2009 | Kawahito et al. | ................. | 341/161 |
| 7,821,433 B2 * | 10/2010 | Abe | ................. | 341/118 |

* cited by examiner

*Primary Examiner* — Khai M Nguyen
(74) *Attorney, Agent, or Firm* — Stout, Uxa, Buyan & Mullins, LLP

(57) ABSTRACT

A switched-capacitor circuit which comprises a first sampling capacitor, a second sampling capacitor, an op-amp, a third capacitor, and a fourth capacitor is provided. The first sampling capacitor is disposed to sample an input signal in a sampling phase. The second sampling capacitor is disposed to sample the input signal in the sampling phase. Wherein, in a first amplify phase, the third capacitor stores an offset voltage of the op-amp, the fourth capacitor stores the electric charges which are flowed from the first sampling capacitor and the second sampling capacitor, and in a second amplify phase, the fourth capacitor gives the stored electric charges back to the first sampling capacitor and the second sampling capacitor.

18 Claims, 4 Drawing Sheets

SWITCHED-CAPACITOR CIRCUIT AND PIPELINED ANALOG-TO-DIGITAL CONVERTER

BACKGROUND OF THE INVENTION

1. Field of the Invention

The present invention generally relates to switched-capacitor circuit, and more particularly to a switched-capacitor circuit which is used in a pipelined analog-to-digital converter (ADC).

2. Description of Related Art

The growing demands for portable communication and audio/video electronic devices call for longer operating time. The battery power, however, could not keep up with pressing need of longer operating time. Reducing power consumption is thus becoming an alternative and more feasible way to reach that object.

The pipelined analog-to-digital converter (ADC) is widely utilized, over other ADC architectures. FIG. 1 illustrates a conventional pipelined ADC architecture 1. The input signal $V_{in}$ is firstly sampled by a front-end sample-and-hold amplifier (SHA) 11, which then provides a stably held signal to a later stage 12. As shown in the expanded block, each stage 12 includes a sub-ADC 121, a sub-DAC (digital-to-analog converter) 122, a sample-and-hold amplifier (SHA) 123, an analog subtractor 124 and an amplifier ($G_i$) 125. In the design of high-resolution pipelined ADC 1, a high-gain op-amp is usually used to process analog signal with high accuracy. However, in advanced CMOS process, the gain value of the amplifier ($G_i$) 125 will be getting smaller due to the facts that the intrinsic gain of the transistors may decrease and the power supply of the pipelined ADC architecture 1 will decrease. Therefore, the high-gain op-amp will face serious design challenge in switched-capacitor circuits.

In order to correct the gain-error of a low-gain op-amp, a correlated double sampling ADC is provided recently, which uses two pairs of capacitors to sample and control the two pairs of capacitors to perform amplifying in different time. This technique nevertheless requires an additional pair of capacitors (or more silicon area), two pairs of capacitors causes double loading, which results in more power consumption. Furthermore, three clock phases are needed in this technique, and thus reduce the operating speed of overall circuits.

For the reason that above-mentioned conventional ADC architectures have respective disadvantages, a need has arisen to propose a novel switched-capacitor circuit which can correct gain-error while using low-gain op-amplifiers to improve the overall efficiency of conventional pipelined ADC architectures.

SUMMARY OF THE INVENTION

In view of the foregoing, it is an object of the present invention to provide a switched-capacitor circuit, which can correct gain-error while using low-gain op-amps, so as to improve the overall efficiency of conventional pipelined ADC architectures.

According to one embodiment, a pipelined analog-to-digital converter (ADC) which comprises a plurality of stage circuits is provided. Each stage comprises a multiplying DAC (MDAC) which comprises a first sampling capacitor, a second sampling capacitor, an op-amp, a third capacitor, and a fourth capacitor. The first sampling capacitor is disposed to sample an input signal in a sampling phase. The second sampling capacitor is disposed to sample the input signal in the sampling phase. Wherein, in a first amplify phase, the third capacitor stores an offset voltage of the op-amp, the fourth capacitor stores the electric charges which are flowed from the first sampling capacitor and the second sampling capacitor, and in a second amplify phase, the fourth capacitor gives the stored electric charges back to the first sampling capacitor and the second sampling capacitor.

According to another embodiment, a switched-capacitor circuit which comprises a first sampling capacitor, a second sampling capacitor, an op-amp, a third capacitor, and a fourth capacitor is provided. The first sampling capacitor is disposed to sample an input signal in a sampling phase. The second sampling capacitor is disposed to sample the input signal in the sampling phase. Wherein, in a first amplify phase, the third capacitor stores an offset voltage of the op-amp, the fourth capacitor stores the electric charges which are flowed from the first sampling capacitor and the second sampling capacitor, and in a second amplify phase, the fourth capacitor gives the stored electric charges back to the first sampling capacitor and the second sampling capacitor.

DETAILED DESCRIPTION OF THE INVENTION

Figure 1:
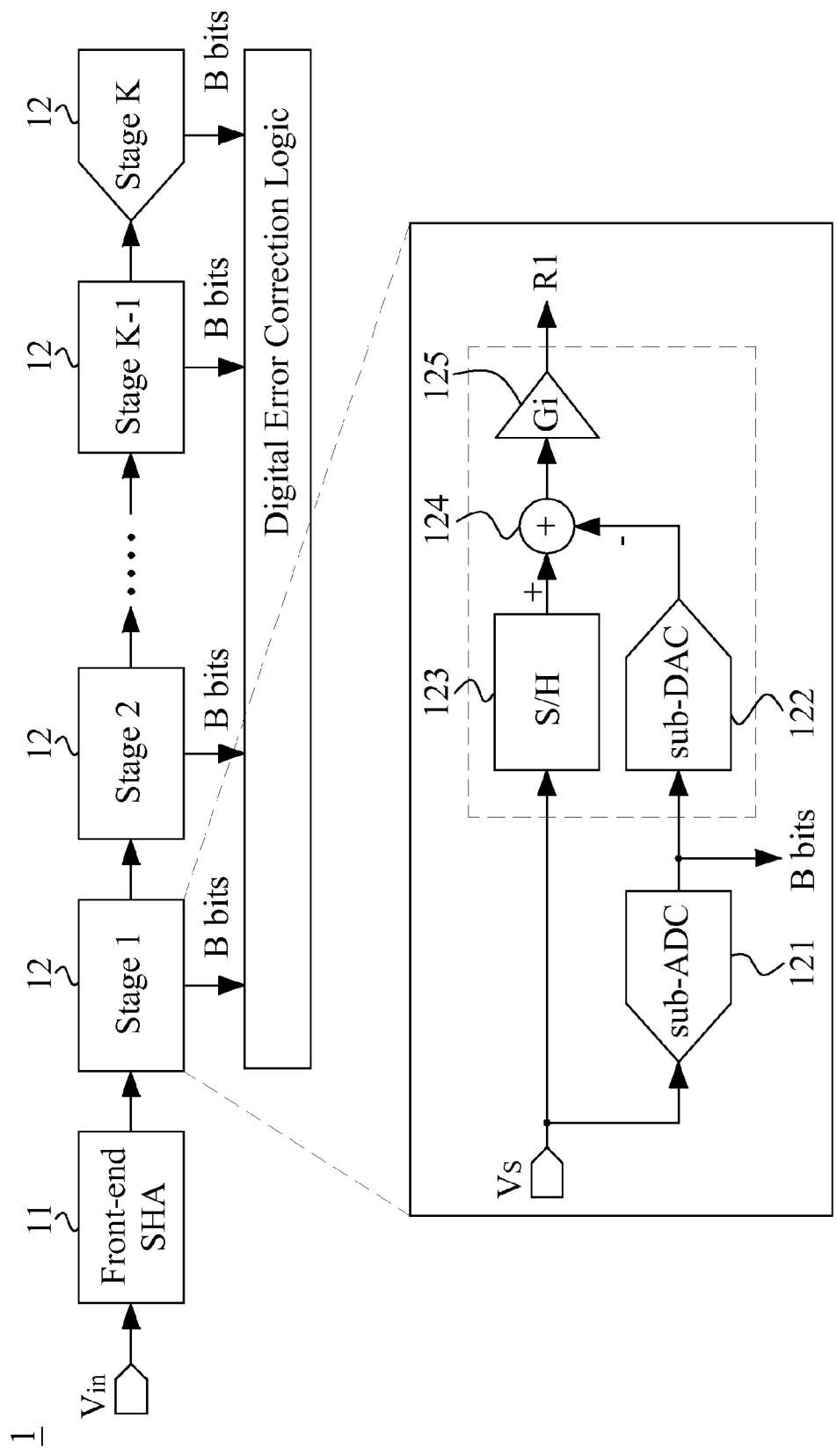
FIG. 1 illustrates a conventional pipelined ADC architecture.
Figure 2:
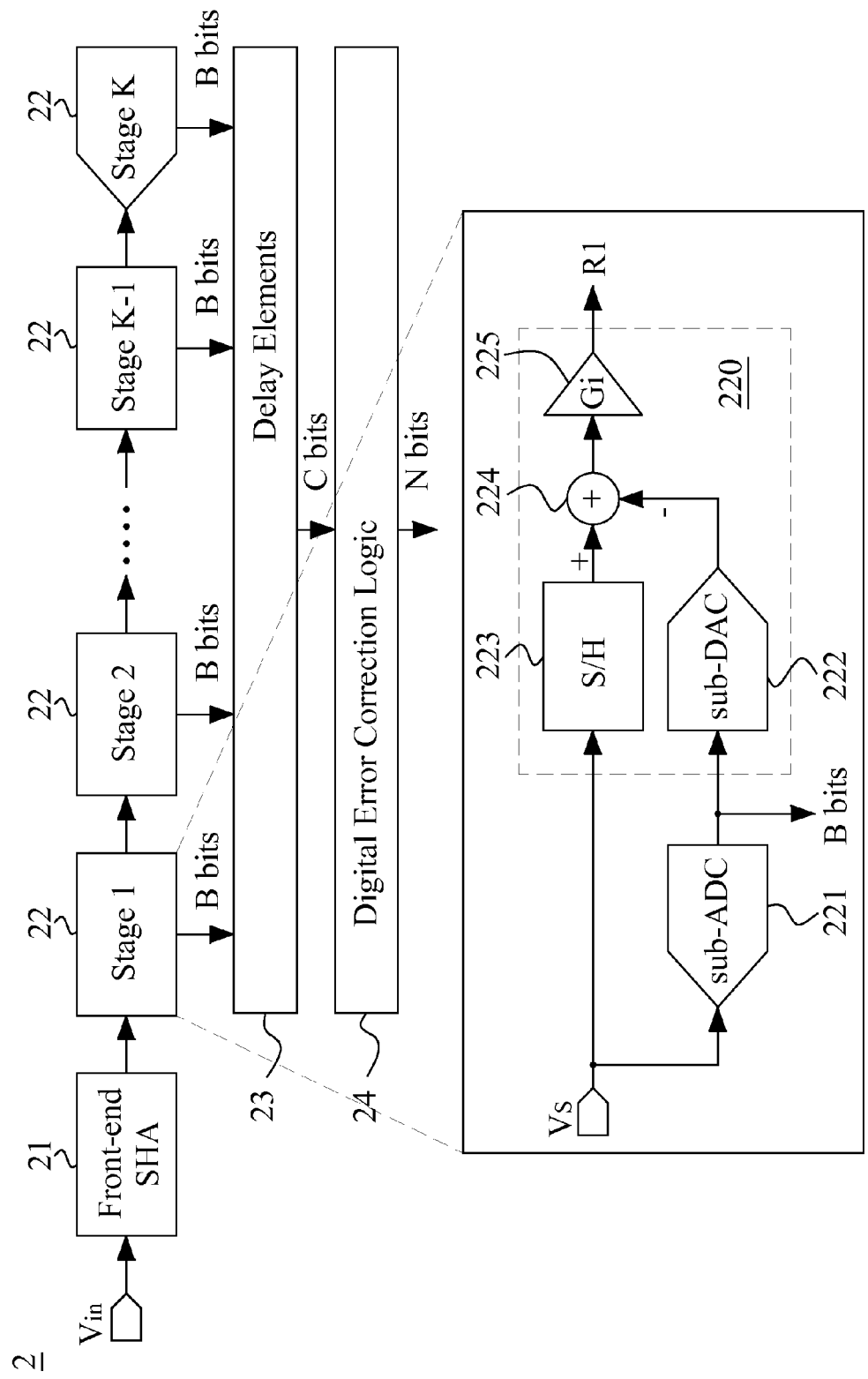
FIG. 2 illustrates a pipelined ADC according to one embodiment of the present invention.

FIG. 2 illustrates a pipelined analog-to-digital (ADC) 2 according to one embodiment of the present invention. As shown in FIG. 2, the pipelined ADC 2 includes a front-end sample-and-hold amplifier (SHA) 21, a plurality of stages 22, a delay element 23, and a digital error correction logic 24. The input signal $V_{in}$ is firstly sampled by a front-end sample-and-hold amplifier (SHA) 21, which then provides a stably held signal to a later stage 22. The delay element 23 is coupled between the output of the plurality of stages 22 and the digital error correction logic 24. Each stage 22 performs a portion of bits (B) of conversion, respectively. The converted bits are synchronized by the delay elements 23, and then corrected and integrated by the digital error correction logic 24, finally outputting a complete N-bit code, where N is the ADC resolution.

As shown in the expanded block, each stage 22 includes a sub-ADC 221, a sub-DAC (digital-to-analog converter) 222, a SHA 223, an analog subtractor 224 and an amplifier (Gi) 225. The sub-ADC 221 of each stage 22 performs coarse quantization on corresponding input signal to generate a portion of bits, which is then converted into associated analog voltage by the sub-DAC 222.

Figure 3:
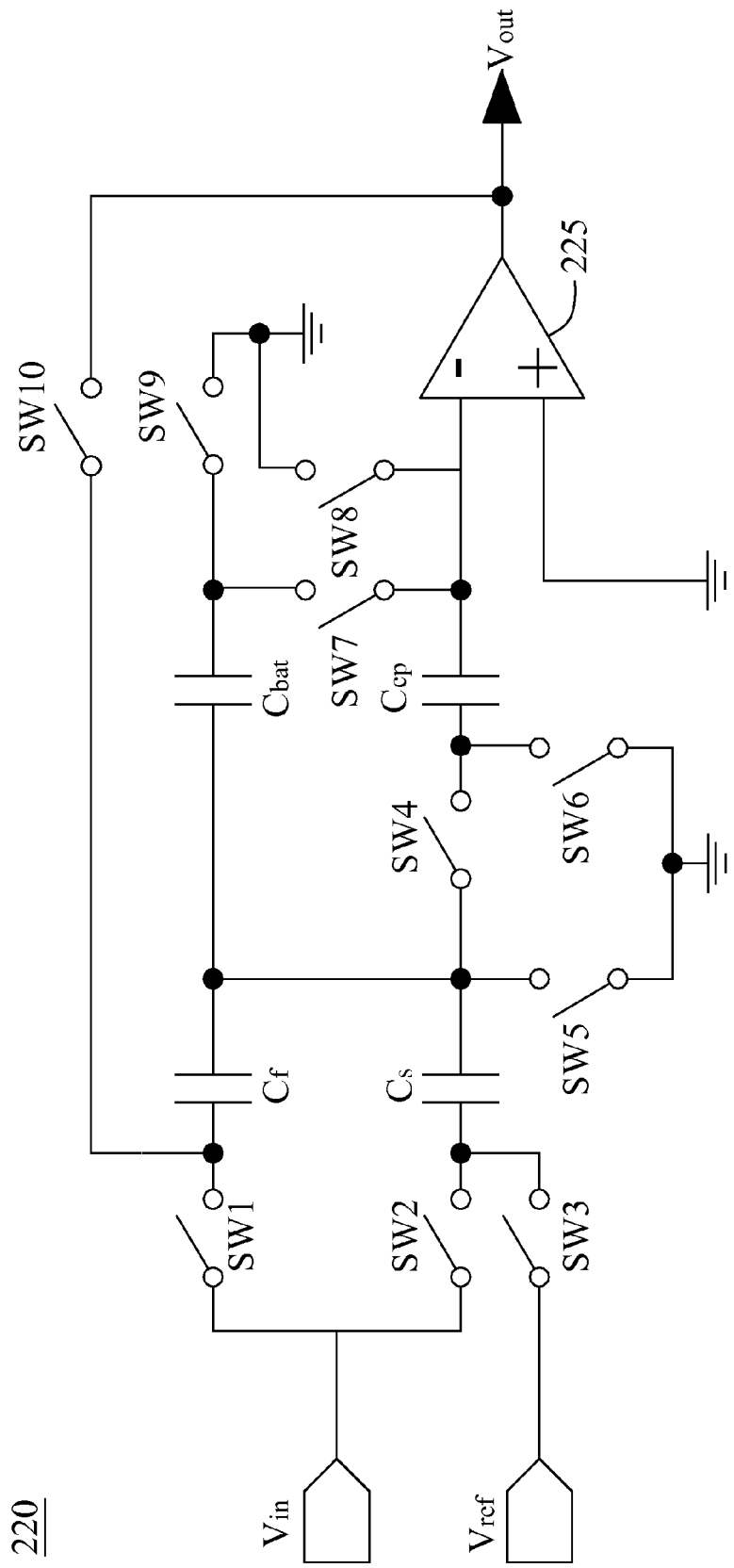
FIG. 3 illustrates a multiplying DAC (MDAC) according to one embodiment of the present invention.

FIG. 3 illustrates a multiplying digital-to-analog converter (MDAC) 220 according to one embodiment of the present invention. The multiplying DAC 220 consists of the sub-DAC 222, the SHA 223, the analog subtractor 224, the amplifier ($G_i$) 225 (such as an operational amplifier or op-amp) and a plurality of switches (SW1-SW10). It provides a reference voltage ($V_{ref}$) which is determined by the output of the sub-ADC 221. The MDAC 220 is implemented, in this example, with switched-capacitor circuit as connected, which includes a first sampling capacitor ($C_f$), a second sampling capacitor ($C_s$), a third capacitor ($C_{cp}$), a fourth capacitor ($C_{bat}$), an op-amp, and a plurality of switches (SW1-SW10). The MDAC 220 at least has three clock phases such as sampling phase, first (time) amplify phase and second (time) amplify phase which are switched via the switches (SW1-SW10).

Figure 4A:
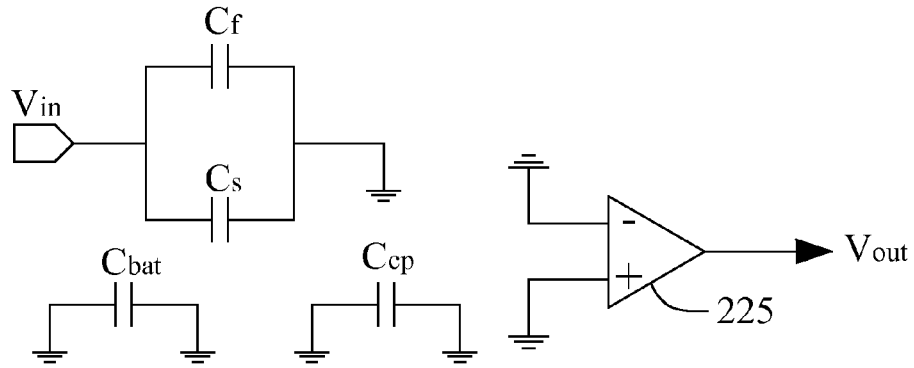
FIGS. 4A-4C illustrate the implementation of the MDAC in FIG. 3.
Figure 4B:
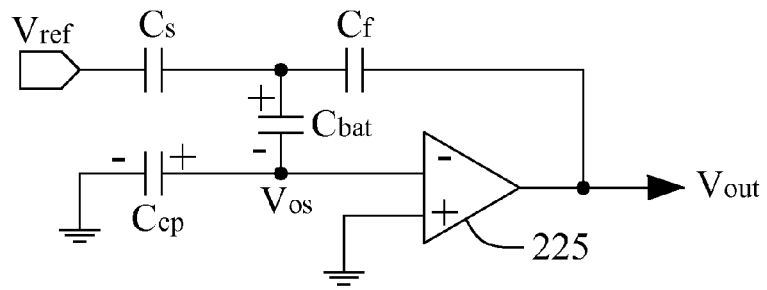
Figure 4C:
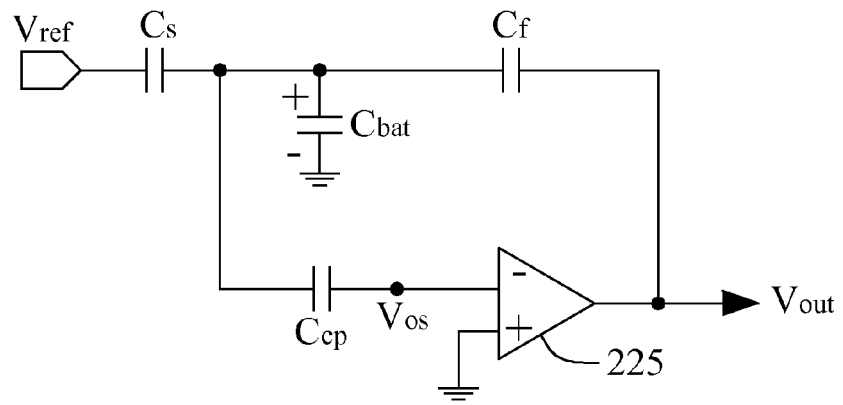

Please also refer to FIGS. 4A-4C, which illustrate the implementation of the MDAC in FIG. 3. As shown in FIG. 4A, when clock Clk1 becomes high ("1"), the switches SW1, SW2, SW5, SW6, SW8, SW9 are turned on, the MDAC 220 enters into sample phase, and the first sampling capacitor ($C_f$) and the second sampling capacitor ($C_s$) sample an input signal ($V_{in}$) in this phase. The first sampling capacitor ($C_f$) and the second sampling capacitor ($C_s$) are parallel connected electronically and are coupled to a predetermined voltage to be reset. Specifically, the predetermined voltage may be, but is not limited to, coupled to a ground end (in Single Ended Circuit) or a common voltage (in Double Ended Differential Circuit).

Then, when clock Clk2 becomes high ("1"), the switches SW3, SW6, SW7, SW10 are turned on, and the MDAC 220 enters into first amplify phase. The capacitor ($C_s$) is coupled to the reference voltage ($V_{ref}$). The input of the op-amp 225 has an offset voltage ($V_{os}$). The third capacitor ($C_{cp}$) and the fourth capacitor ($C_{bat}$) are electronically connected to the input of the op-amp 225 via opposite plates, and the fourth capacitor ($C_{bat}$) is electronically connected to the first sampling capacitor ($C_f$) and the second sampling capacitor ($C_s$), respectively. In the first amplify phase, the third capacitor ($C_{cp}$) stores the offset voltage ($V_{os}$) of the op-amp 225. In order to prevent electric charges from flowing to the third capacitor ($C_{cp}$), the fourth capacitor ($C_{bat}$) stores electric charges which are flowed from the capacitors ($C_f$, $C_s$) temporarily. Also, the fourth capacitor ($C_{bat}$) stores a quantity of electric charges which is equal to the third capacitor ($C_{cp}$) base on the law of conservation of electric charges.

Finally, when clock Clk3 becomes high ("1"), the switches SW3, SW4, SW9, SW10 are turned on, and the MDAC 220 enters into second amplify phase. The third capacitor ($C_{cp}$) is coupled between one end of the fourth capacitor ($C_{bat}$) and the op-amp 225, and the other end of the fourth capacitor ($C_{bat}$) is coupled to the predetermined voltage (ground end or a common voltage). In second amplify phase, the fourth capacitor ($C_{bat}$) gives the stored electric charges back to the capacitors ($C_f$, $C_s$), and thus the voltage of the end which is coupled to the capacitors ($C_f$, $C_s$) of the fourth capacitor ($C_{bat}$) may be substantially equal to the predetermined voltage. In amplify phases, the fourth capacitor ($C_{bat}$) prevents electric charges of the capacitors ($C_f$, $C_s$) from flowing to the third capacitor ($C_{cp}$), therefore it may not change the input signal sampled by the capacitors ($C_f$, $C_s$) which results in the gain-error of the op-amp 225.

It is noted that the first sampling capacitor ($C_f$) is always coupled between the second sampling capacitor ($C_s$) and the output ($V_{out}$) of the op-amp 225 during the first amplify phase and the second amplify phase, and acts as feedback capacitor. Therefore, the output ($V_{out}$) of the op-amp 225 may not be interfered when switching phases, so as to maintain more stable output. Furthermore, the multiplying DAC 220 architecture of the present invention can overcome the disadvantage of double loading in the prior art, so as to improve implement speed of circuits.

Although specific embodiments have been illustrated and described, it will be appreciated by those skilled in the art that various modifications may be made without departing from the scope of the present invention, which is intended to be limited solely by the appended claims.

What is claimed is:

1. A pipelined analog-to-digital converter (ADC), comprising:
   a plurality of stages, each having:
      a multiplying digital-to-analog converter (MDAC), comprising:
         a first sampling capacitor disposed to sample an input signal in a sampling phase;
         a second sampling capacitor disposed to sample the input signal in the sampling phase;
         an operational amplifier (op-amp);
         a third capacitor; and
         a fourth capacitor;
      wherein, in a first amplify phase, the third capacitor stores an offset voltage of the op-amp, the fourth capacitor stores the electric charges which are flowed from the first sampling capacitor and the second sampling capacitor, and in a second amplify phase, the fourth capacitor gives the stored electric charges back to the first sampling capacitor and the second sampling capacitor.

2. The pipelined ADC of claim 1, further comprising a plurality of switches disposed to switch the sampling phase, the first amplify phase and the second amplify phase.

3. The pipelined ADC of claim 2, wherein the first sampling capacitor and the second sampling capacitor are parallel connected electronically and are coupled to a predetermined voltage in the sampling phase.

4. The pipelined ADC of claim 3, wherein the op-amp has an output end, and the first sampling capacitor is coupled between the second sampling capacitor and the output end of the op-amp during the first amplify phase and the second amplify phase.

5. The pipelined ADC of claim 4, wherein in the first amplify phase, the second sampling capacitor is coupled to a reference voltage, the third capacitor and the fourth capacitor are electronically connected to the op-amp via opposite plates, and the fourth capacitor is electronically connected to the first sampling capacitor and the second sampling capacitor, respectively.

6. The pipelined ADC of claim 5, wherein in the second amplify phase, the third capacitor is coupled between one end of the fourth capacitor and the op-amp, and the other end of the fourth capacitor is coupled to the predetermined voltage.

7. The pipelined ADC of claim 1, wherein each stage further comprises:
   a sub-ADC that performs coarse quantization on an input signal of said stage.

8. The pipelined ADC of claim 7, further comprising a front-end sample-and-hold amplifier that provides the input signal to the plurality of stages.

9. The pipelined ADC of claim 1, further comprising a digital error correction logic circuit that corrects and integrates the outputs of the plurality of stages.

10. The pipelined ADC of claim 6, wherein the predetermined voltage is a common voltage or is coupled to a ground end.

11. A switched-capacitor circuit, comprising:
   a first sampling capacitor disposed to sample an input signal in a sampling phase;
   a second sampling capacitor disposed to sample the input signal in the sampling phase;
   an operational amplifier (op-amp);
   a third capacitor; and
   a fourth capacitor;
   wherein, in a first amplify phase, the third capacitor stores an offset voltage of the op-amp, the fourth capacitor stores the electric charges which are flowed from the first sampling capacitor and the second sampling capacitor, and in a second amplify phase, the fourth capacitor gives the stored electric charges back to the first sampling capacitor and the second sampling capacitor.

12. The switched-capacitor circuit of claim 11, further comprising a plurality of switches disposed to switch the sampling phase, the first amplify phase and the second amplify phase.

13. The switched-capacitor circuit of claim 12, wherein the first sampling capacitor and the second sampling capacitor are parallel connected electronically and are coupled to a predetermined voltage in the sampling phase.

14. The switched-capacitor circuit of claim 13, wherein the op-amp has an output end, and the first sampling capacitor is coupled between the second sampling capacitor and the output end of the op-amp during the first amplify phase and the second amplify phase.

15. The switched-capacitor circuit of claim 14, wherein in the first amplify phase, the second sampling capacitor is coupled to a reference voltage, the third capacitor and the fourth capacitor are electronically connected to the op-amp via opposite plates, and the fourth capacitor is electronically connected to the first sampling capacitor and the second sampling capacitor, respectively.

16. The switched-capacitor circuit of claim 15, wherein the third capacitor is coupled between one end of the fourth capacitor and the op-amp, and the other end of the fourth capacitor is coupled to the predetermined voltage.

17. The switched-capacitor circuit of claim 16, comprising a multiplying digital-to-analog converter (MDAC).

18. The switched-capacitor circuit of claim 16, wherein the predetermined voltage is a common voltage or is coupled to a ground end.

* * * * *